US011598010B2

(12) United States Patent
Giatis

(10) Patent No.: US 11,598,010 B2
(45) Date of Patent: Mar. 7, 2023

(54) TWO TERMINAL CORROSION PROTECTION DEVICE, SYSTEM, AND METHOD

(71) Applicant: Canadian Auto Preservation Inc., Richmond Hill (CA)

(72) Inventor: Petros Z. Giatis, Hinckley, OH (US)

(73) Assignee: Canadian Auto Preservation Inc., Richmond Hill (CA)

(*) Notice: Subject to any disclaimer, the term of this patent is extended or adjusted under 35 U.S.C. 154(b) by 74 days.

(21) Appl. No.: 17/232,967

(22) Filed: Apr. 16, 2021

(65) Prior Publication Data

US 2021/0238751 A1 Aug. 5, 2021

Related U.S. Application Data

(63) Continuation-in-part of application No. PCT/CA2020/051417, filed on Oct. 22, 2020.
(Continued)

(51) Int. Cl.
*C23F 13/00* (2006.01)
*H03K 5/1252* (2006.01)

(52) U.S. Cl.
CPC ......... *C23F 13/005* (2013.01); *H03K 5/1252* (2013.01); *C23F 2213/10* (2013.01); *C23F 2213/20* (2013.01)

(58) Field of Classification Search
CPC .... C23F 13/00; C23F 13/005; C23F 2213/10; C23F 2213/20; C23F 13/04
See application file for complete search history.

(56) References Cited

U.S. PATENT DOCUMENTS 4,226,694 A 10/1980 Baboian et al.
4,479,399 A * 10/1984 Narveson ............ F16D 48/062
192/48.618
(Continued)

FOREIGN PATENT DOCUMENTS

CA 2474444 A1 11/2005
CN 1948556 A 4/2007
(Continued)

OTHER PUBLICATIONS

CN 108456887 A Google Translation (Year: 2021).*
(Continued)

*Primary Examiner* — Alexander W Keeling
(74) *Attorney, Agent, or Firm* — Taft Stettinius & Hollister LLP

(57) ABSTRACT

A corrosion protection device, system, and method are provided. The device may operate while being coupled to the object being protected and to a power source using a total of only two terminals. This may be accomplished by de-referencing the return path node of the circuit using a choke device that blocks a temporal AC component of an anti-corrosion signal. The choke device therefore diverts the anti-corrosion signal to a single negative/ground path to the object and then returns through a positive lead of the circuit. A two terminal corrosion protection device may thereby simplify the installation process, for example on a vehicle, by not requiring that another connection be made to the object at a spaced apart location from a first connection to the object.

30 Claims, 8 Drawing Sheets

Related U.S. Application Data

(60) Provisional application No. 62/925,486, filed on Oct. 24, 2019.

(56) References Cited

U.S. PATENT DOCUMENTS

| | | | | |
|---|---|---|---|---|
| 5,407,549 | A * | 4/1995 | Camp | C23F 13/02 |
| | | | | 204/196.05 |
| 5,747,892 | A * | 5/1998 | Staerzl | G01R 31/52 |
| | | | | 439/938.1 |
| 5,952,812 | A | 9/1999 | Maeda | |
| 7,198,706 | B2 * | 4/2007 | Lewis | C23F 13/04 |
| | | | | 204/196.02 |
| 9,353,446 | B2 * | 5/2016 | Mulcahy | C23F 13/04 |
| 10,585,268 | B2 * | 3/2020 | Okuoka | G02B 13/02 |
| 2009/0203247 | A1 | 8/2009 | Fifelski et al. | |
| 2018/0119290 | A1 * | 5/2018 | Camp | G01N 17/02 |
| 2018/0201526 | A1 * | 7/2018 | Chew | C02F 5/00 |

FOREIGN PATENT DOCUMENTS

| | | | |
|---|---|---|---|
| CN | 108456887 | A * | 8/2018 |
| CN | 108456887 | A | 8/2018 |
| DE | 3916847 | A1 | 11/1990 |
| JP | 2008121061 | A | 5/2008 |
| JP | 2015183223 | A | 10/2015 |
| JP | 2018123394 | A | 8/2018 |
| KR | 101279836 | B1 | 7/2013 |
| WO | 2017018930 | A1 | 2/2017 |

OTHER PUBLICATIONS

International Search Report; International Searching Authority; International Patent Application No. PCT/CA2020/051417; dated Dec. 29, 2020; 4 pages.

Written Opinion of the International Searching Authority; International Searching Authority; International Patent Application No. PCT/CA2020/051417; dated Dec. 29, 2020; 6 pages.

Canadian Patent Application No. 3,118,018, Office Action dated Jul. 30, 2021.

* cited by examiner

TWO TERMINAL CORROSION PROTECTION DEVICE, SYSTEM, AND METHOD

CROSS-REFERENCE TO RELATED APPLICATIONS

This application claims the benefit of priority of U.S. Provisional Patent Application No. 62/925,486 filed on Oct. 24, 2019, and of Patent Cooperation Treaty Application PCT/CA2020/051417 filed on Oct. 22, 2020, which are incorporated herein by reference.

FIELD

The present disclosure relates generally to corrosion protection. More particularly, the present disclosure relates to non-cathodic corrosion protection devices and methods.

BACKGROUND

In an oxidizing environment, there are substances that under suitable conditions, take up electrons and become reduced. These electrons typically come from the atoms of metal objects exposed to the oxidizing environment. An oxidizing environment is characterized by the presence of at least one chemical, the atoms of which, in that environment, are capable of being reduced by acquiring at least one electron from the atoms of the metal. In "donating" an electron, the metal becomes oxidized. As the process of oxidation continues, a metal object becomes degraded to the point that it can no longer be used for its intended purpose. In other circumstances, the degradation may be aesthetically unpleasant, for example rust developing on an object.

Some attempted solutions for preventing oxidation include cathodic protection systems. In these systems, the metal object to be protected is made the cathode of an electrical circuit. The metal object to be protected and an anode are connected to a source of electrical energy, the electrical circuit being completed from the anode to the cathode through an aqueous solution. The flow of electrons provides the necessary source of electrons to the substances in the aqueous solution that normally cause oxidation, thereby reducing the "donation" of electrons coming from the atoms of the protected metal (cathode). However, such cathodic protection systems are of limited use in protecting metal objects that are not at least partially submerged in a conductive medium, such as sea water or conductive soil. As a result, many metal objects cannot be effectively protected by these cathodic systems.

Another type of approach has been to use an electrical device to generate and apply an electrical signal to the metal object. An effect of the signal on the metal object can be to reduce a rate of corrosion of the metal objection. These devices have typically required three terminals, or wires, for coupling the circuit to both the metal object and a power source. These devices can be difficult to install, for example on vehicles.

Accordingly, improvements in corrosion protection devices and methods are desired.

BRIEF DESCRIPTION OF THE DRAWINGS

Embodiments of the present disclosure will now be described, by way of example only, with reference to the attached Figures.

DETAILED DESCRIPTION

Figure 1:
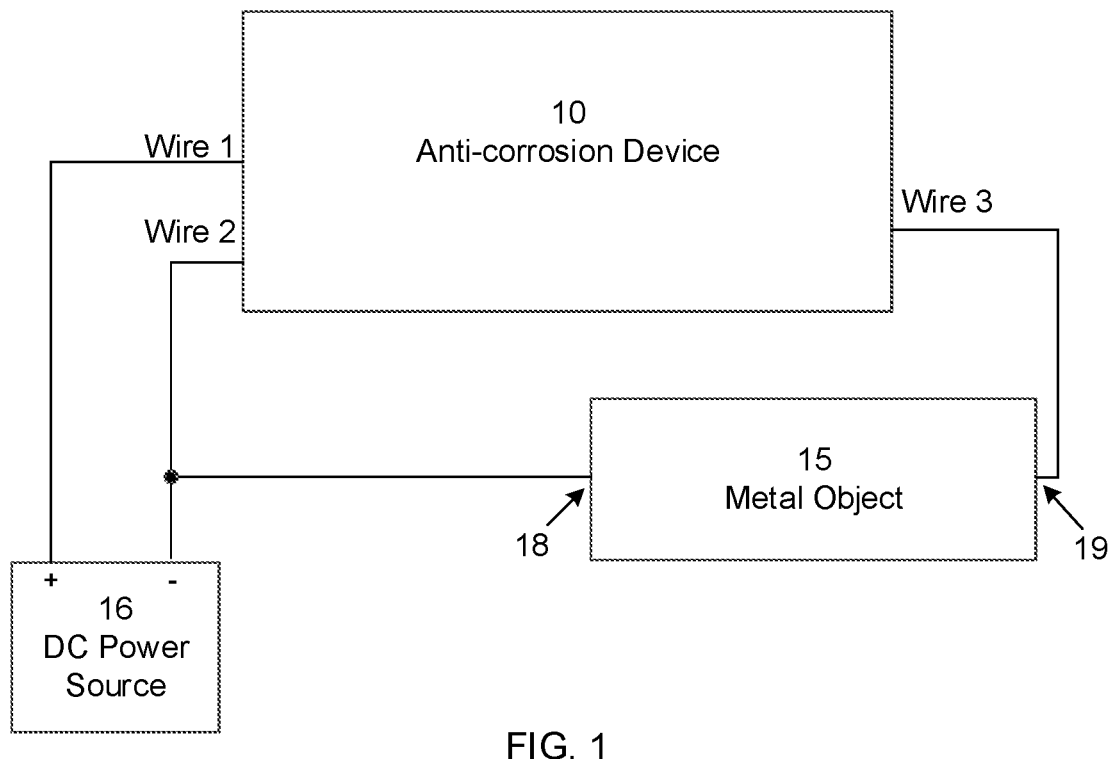
FIG. 1 is a block diagram of a three-wire non-cathodic corrosion protection device.

The present disclosure generally relates to improvements in corrosion protection for metal objects. In particular, the present disclosure relates to improved corrosion protection devices, systems, and methods.

According to an aspect, the present invention provides a method and system for reducing a rate of corrosion of a metal object. The method and system may include generating an electrical signal, for example a waveform(s) signal(s), coupling the electrical waveform to the metal object, and inducing a current in the metal object in response to the electrical waveform. The electrical waveform may have predetermined characteristics and may be generated from a DC voltage source such that the waveform has a temporal alternating current (AC) component. The signal may be referred to sometimes as an anti-corrosion signal.

According to an aspect, the present disclosure provides a corrosion protection device or system that uses only two wires, terminals, or other electrical connections to carry out its anti-corrosion function. In an aspect, this may be accomplished by de-referencing a return path node of a circuit that generates anti-corrosion electrical waveform signals using a device, such as a choke device, that puts the reference of the circuit at a different voltage from that of the output signal connected to the negative path. By doing this, the output signal is diverted to a single negative/ground path to the metal object that the signal is designed to protect. The signal may then return through the positive lead of the circuit. In an embodiment, the device may have more than two terminals.

Further, in an aspect, a corrosion protection device is provided that uses only two terminals to both carry out its anti-corrosion function and to receive power from a power source.

In an aspect, the present disclosure provides a corrosion protection device comprising a first terminal and a second terminal for coupling to a respective first node and second node of a power source, a corrosion protection module for generating an electrical waveform signal having a temporal AC component at an output port of the corrosion protection module, wherein the output port is coupled to the second terminal, a choke device coupling the output port to a return port of the corrosion protection module such that the choke blocks the temporal AC component of the waveform signal from entering the return port, and such that the temporal AC component of the waveform signal is able to flow to the second terminal.

In an embodiment, the corrosion protection device is configured for reducing a rate of corrosion of a metal object by coupling the power source and the metal object to the device via only the first and second terminals.

In an embodiment, the second terminal is a negative terminal for receiving a negative voltage from the power source.

In an embodiment, the corrosion protection module further comprises an input port, wherein the input port is coupled to the first terminal.

In an embodiment, the choke device comprises a resistor.

In an embodiment, the choke device comprises a ferrite bead.

In an embodiment, the choke device comprises an inductor.

In an embodiment, the choke device comprises a diode.

In an embodiment, the choke device comprises a switching device that electrically decouples the output port from the return port while the waveform signal is generated, and that electrically couples the second terminal to the return port while the waveform signal is not being generated.

In an embodiment, the electrical waveform signal has a frequency within the range of 1 kHz to 10 kHz, or 20 Hz to 1 MHz.

In an embodiment, the temporal AC component has a frequency within the range of 1 kHz to 10 kHz, or 20 Hz to 1 MHz.

In an aspect, the present disclosure provides a method for reducing a rate of corrosion of a metal object, the method comprising providing a corrosion protection device having first and second terminals, coupling the device to the metal object using the second terminal of the device, generating an electrical waveform signal having a temporal AC component at a corrosion protection module of the device, returning the electrical waveform signal to the corrosion protection module, wherein the returning comprises blocking the temporal AC component of the waveform signal, and providing the electrical waveform signal to the second terminal for inducing a current in the metal object.

In an embodiment, the method comprises coupling a power source and the metal object to the device via only the first and second terminals, wherein the power source powers the device.

In an embodiment, the second terminal is a negative terminal for receiving a negative voltage from a power source.

In an embodiment, the method comprises coupling the first terminal to an input port of the corrosion protection module.

In an embodiment, the blocking involves the use of a resistor.

In an embodiment, the blocking involves the use of a ferrite bead.

In an embodiment, the blocking involves the use of an inductor.

In an embodiment, the blocking involves the use of a diode.

In an embodiment, the blocking involves blocking the entire electrical waveform signal while the waveform signal is generated, and coupling the second terminal to a return port of the corrosion protection module while the waveform signal is not being generated.

In an embodiment, the electrical waveform signal has a frequency within the range of 1 kHz to 10 kHz, or 20 Hz to 1 MHz.

In an embodiment, the metal object is part of a vehicle.

In an aspect, the present disclosure provides a device, comprising a first terminal and a second terminal for coupling to a power source, a corrosion protection module having a first port and a return port, the first port being coupled to the first terminal and the corrosion protection module configured to output, from the first port, an anti-corrosion signal having an AC component, and a return path device coupled in series between the first port and the return port and being configured to prevent the AC component of the anti-corrosion signal from entering the return port.

In an embodiment, the device is configured for reducing a rate of corrosion of a metal object by coupling the power source and the metal object to the device via only the first and second terminals.

In an embodiment, the first terminal is configured for coupling to a negative terminal of the power source.

In an embodiment, the second terminal is configured for coupling to a positive terminal of the power source.

In an embodiment, the corrosion protection module further comprises an input port coupled to the second terminal.

In an embodiment, the return path device includes a resistor.

In an embodiment, the return path device includes a ferrite bead.

In an embodiment, the return path device includes an inductor.

In an embodiment, the return path device includes a diode.

In an embodiment, the return path device includes a switching device that electrically decouples the output port from the return port while outputting the anti-corrosion signal and electrically couples the second terminal to the return port while not outputting the anti-corrosion signal.

In an embodiment, the anti-corrosion signal has a frequency within the range of 1 kHz to 10 kHz, or 20 Hz to 1 MHz.

FIG. 1 is a block diagram of a system comprising a previous anti-corrosion device 10 for producing an anti-corrosion electrical waveform, a DC power source 16, and a metal object 15 to be protected by anti-corrosion device 10. As shown and labeled in FIG. 1, device 10 has three terminals or wires to couple device 10 to power source 16 and metal object 15. Two wires Wire 1 and Wire 2 are used to power device 10 and the third wire, Wire 3, is used to output the anti-corrosion waveform. Wire 1 is connected to the positive node of power source 16 and Wire 2 is connected to a negative/ground path. Wire 3 contains the anti-corrosion waveform. FIG. 1 illustrates how Wire 3 is installed on metal object 15 at some distance from the installation point of Wire 2, such that the anti-corrosion waveform propagates from the connection point 19 of Wire 3 on metal object 15 to the connection point 18 of Wire 2 on metal object 15. Depending on the application, having to install Wire 2 and Wire 3 at spaced apart locations at metal object 15 can add complexity to the installation of anti-corrosion device 10. For instance, when an anti-corrosion device is installed on a vehicle, routing and connecting a third wire (e.g. a Wire 3) to the metal object 15, for example to part of the body of the vehicle, may be complicated.

Figure 2:
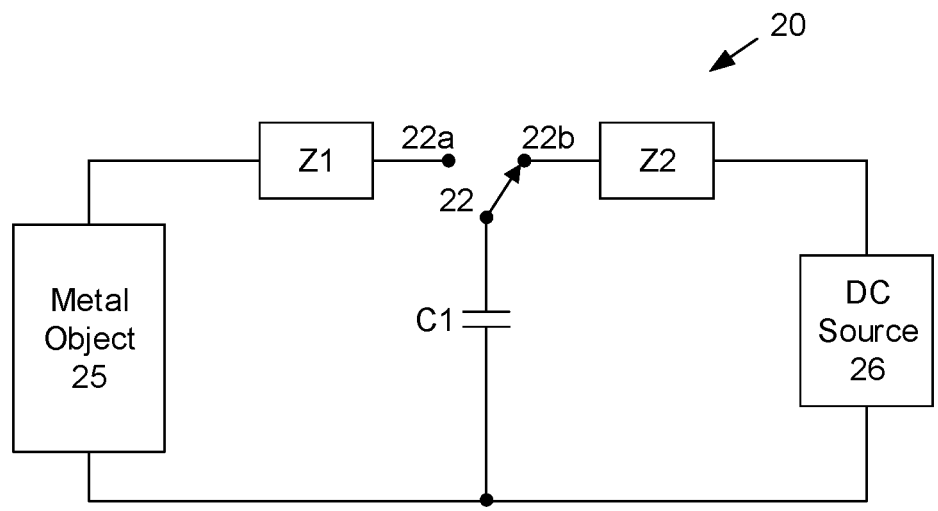
FIG. 2 is a block diagram of a corrosion protection circuit.

FIG. 2 is a block diagram of a previous anti-corrosion circuit 20 for producing an anti-corrosion electrical signal, a DC power source 26, and a metal object 25 to be protected by anti-corrosion circuit 20. Circuit 20 comprises impedance devices Z1 and Z2, capacitor C1, switch 22. Switch 22, in position 22b, may be used to charge capacitor C1. Switch 22 may then be moved to position 22a to enable the discharge of capacitor C1, thereby providing an anti-corrosion capacitive discharge signal to metal object 25.

A challenge with prior systems having three or more terminals relates to the need to install a third conductor to provide the anti-corrosion signal at some distance from the return path of the module. This may be due to a need of a reactive load created through the distance of the metal body. This may create challenges in the installation of the corrosion protection device. Furthermore, there may also be a challenge of having to physically route a third conductor, for example when the device is installed in a vehicle.

The present disclosure provides, in an aspect, a corrosion protection device that requires the use of only two terminals to carry out its anti-corrosion function. Further, a corrosion protection device is provided that requires the use of only two terminals to both carry out its anti-corrosion function and to receive power from a power source.

Generally, in an aspect, the present disclosure provides a circuit, device, or system with a configuration that creates a switch to ground, or creates an AC/DC load between a return (negative wire) and an anti-corrosion waveform signal. This may be accomplished by using, for example, a load, or by a switching method between the ground of the circuit and the negative terminal of a power source to generate the waveform signal that can be sent out on the ground wire, hence resulting in a two terminal device. By doing this, it is possible to create a virtual system node at a different electrical potential (a system floating ground) while diverting the waveform signal to pass down the ground wire. Accordingly, in essence, the waveform signal may be transmitted to the metal object via one of the two terminals of the device that are also used for receiving power at the device. This is in contrast to the device having a third dedicated terminal or wire for delivering the waveform signal to the metal object, such as Wire 3 in the devices of FIG. 1 and FIG. 2.

The electrical waveform signal, when applied to the metal object, may induce a current at the metal object, which in turn may inhibit corrosion of the metal objection. The current may be in the form of, or comprise, a surface current over the metal object. The surface current may cover some, most, or all of surface of the metal object.

In the present two terminal solution, the system voltage range may vary depending on the application it is designed for. System voltage is the voltage at which the device is powered. In an example embodiment, the system voltage of the corrosion protection device may fall within a range of 5V 24V. However, the system voltage may be any other suitable voltage. A negative terminal of the device may be coupled to a corresponding negative voltage, for instance from a power source, for example in a range of −5 to −24 V. The frequency or repetition rate of the anti-corrosion waveform signal may differ by embodiment, and may be selected to have any suitable value. For instance, in an example embodiment, the frequency may be set any suitable value within a range of, for example, from 1 MHz down to constant excitation (meaning 0 Hz). In one or more embodiments, the frequency may be set in the range of around 1 kHz to 20 kHz, or 1 kHz to 10 kHz, or 20 Hz to 1 MHz. In some embodiments, the frequency may be 2.5 kHz, 5 kHz, 7.5 kHz, 10 kHz, or any other suitable value below, between, or above these values.

The waveform of the signal may be of any suitable type and/or shape. In an embodiment, a temporal AC component of the waveform signal may comprise sinusoid(s). However, it is to be appreciated that, in other embodiments, other suitable waveform(s) may be applied with similar effectiveness. In one or more embodiments, the waveform may comprise one or more of sinusoids, pulses, squares, ramps, sawtooths, triangles, noise, random shapes, or combinations thereof. In an embodiment, the waveform signal may be or comprise an AC signal. In an embodiment, the waveform signal may be or comprise an RF signal.

Figures 3, 3A:
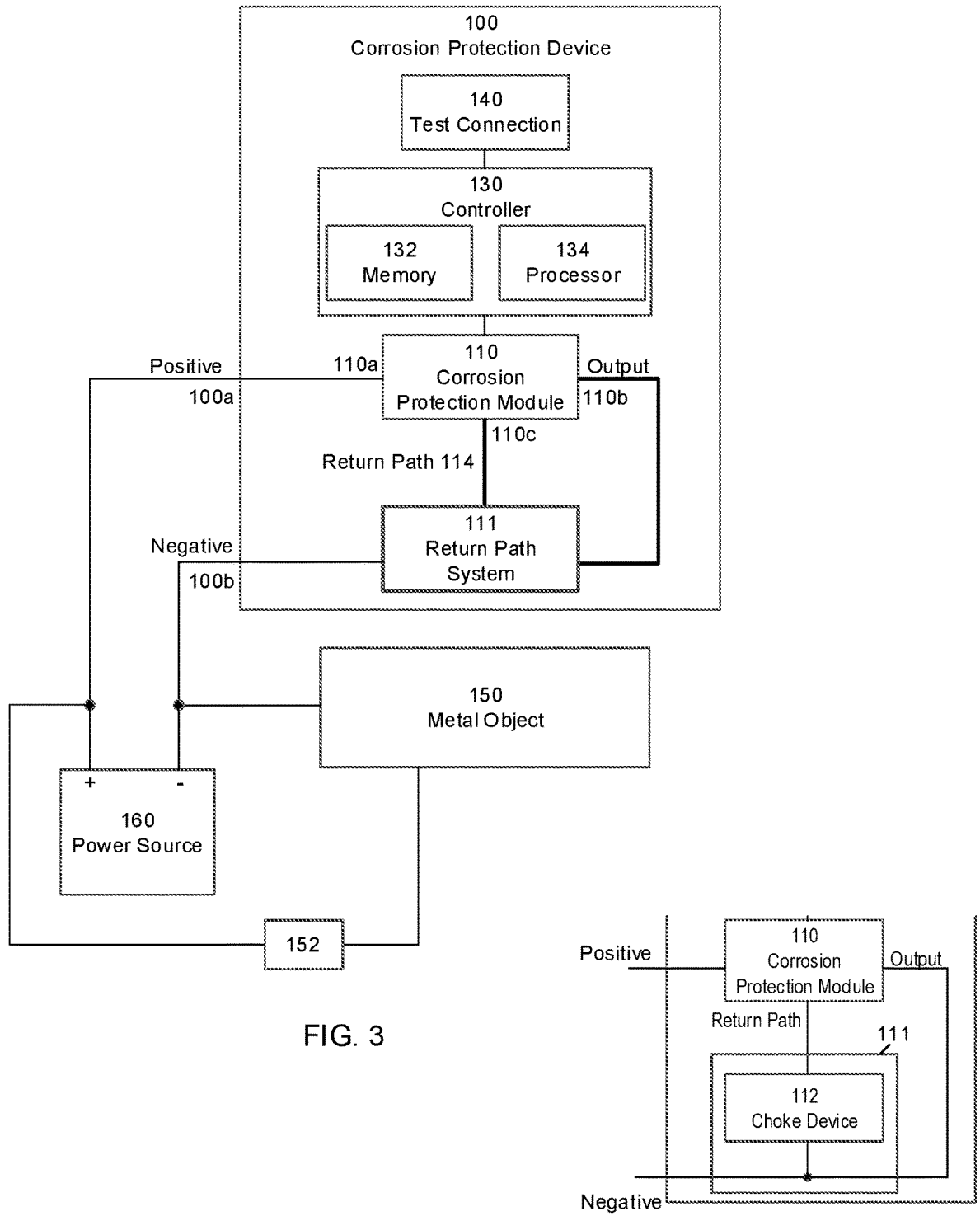
FIG. 3 is a block diagram of an embodiment of a corrosion protection device according to the present disclosure in an example application.
FIG. 3A is a block diagram showing part of an embodiment comprising a choke device.

FIG. 3 is a block diagram illustrating an example embodiment of a corrosion protection device 100 according to the present disclosure in combination with a metal object 150 and a power source 160. In this embodiment, device 100 has two external terminals 100a, 100b, where one is coupled to a positive node, and the other to a negative node, of power source 160. Power source 160 may comprise a DC power source or an AC power source.

Device 100 may generally comprise a corrosion protection module 110, which may have an input port 110a, an output port 110b, and/or a return port 110c. Corrosion protection module 110 may comprise circuitry or other components to generate an anti-corrosion waveform signal, which may be output at output port 110b. Module 110 may be powered by a power source, such as power source 160. Input port 110a may be coupled to one of the nodes of power source 160. In the embodiment of FIG. 3, input port 110a is coupled to the positive node of power source 160, while return path system 111 is coupled to the negative node of power source 160. However, in another embodiment, input port 110a may coupled to the negative node of power source 160 and return path system 111 may coupled to the positive node of power source 160.

Further, rather than having a third external terminal for transmitting the anti-corrosion waveform signal to metal object 150, device 100 instead may be configured to put the anti-corrosion waveform signal on its terminals 100a, 100b through which it receives power. In this embodiment, as shown in FIGS. 3 and 3A, output port 110b is coupled to negative terminal 100b, thereby enabling the waveform signal to be provided at terminal 100b. Further, the output of corrosion protection module 110 is provided back to corrosion protection module 110 via the return port 110c via a return path 114. However, to prevent part or all of the waveform signal from reaching return port 110c, a return path system 111 is positioned between return port 110c. Return path system 111 may comprise circuitry and/or component(s) for blocking part or all of the waveform signal. In an embodiment, return path system 111 may comprise circuitry and/or component(s) for blocking a temporal AC component of the waveform signal. Various examples of structures and configurations for achieving this blocking or filtering are discussed below, including with reference to FIGS. 5 to 10. By blocking part or all of the waveform signal, return path system 111 forces the waveform signal to terminals 100a, 100b of corrosion protection device 100. Waveform signal then travels to metal object 150.

FIG. 3A is a block diagram showing part of an embodiment where return path system 111 consists of or comprises a choke device 112. In this way, waveform signal may flow out of the negative terminal of device 100 but is blocked from flowing in the return path back to corrosion protection module 110. Choke device 112 may also be referred to as a return path device.

As used herein, the terms choke and choke device generally refer to any types of devices that block part or all of a signal. A choke device may block higher frequency signals but allow DC and possibly lower frequency signals to pass. In embodiments according to the present disclosure, the choke device may be selected or configured so that it blocks the temporal AC component of the waveform signal. In an embodiment, the choke device may be or comprise an AC choke, an RF choke, and/or some other frequency resistive element(s). In some embodiments, a choke device may completely block the waveform signal. In this regard, the choke device may comprise a switch.

Again, negative terminal 100b of corrosion protection device 100 may be coupled directly or indirectly to the negative node of power source 160; in parallel is a coupling to metal object 150. Accordingly, negative terminal 100b of corrosion protection device 100 is coupled in parallel to metal object 150 and negative node of power source 160. FIG. 3 also shows a coupling between metal object 150 and the positive terminal of power source 160 for providing at least a return path for the DC component of the waveform signal. A temporal AC component of the waveform signal may also travel along this return path, or alternatively, it may be left floating. One or more components 152 may be present in this coupling path. For instance, component 152 may comprise one or more components of a vehicle, such as a by-pass capacitor of other electronics and/or a lighting device. Since component 152 may already be coupled to both power source 160 and to metal object 150, for example an electrical component that is coupled to the metal body of a vehicle, this coupling may serve as a return path for the waveform signal without having to install a new conductor when corrosion protection device 100 is installed.

A two terminal corrosion protection device may simplify the installation of the device compared to a traditional three terminal device. In an application where the device is installed on a vehicle, the installation may be simplified by taking advantage of existing connection points, such as but not limited to electrical ports, of the vehicle. In one example, a corrosion protection device according to the present disclosure may be connected under the hood of the vehicle directly to the battery in order to radiate the corrosion signal to the entire vehicle metal body. In another example, a corrosion protection device according to the present disclosure may be configured to have a universal serial bus (USB) interface for connection to any vehicle USB port to radiate the corrosion signal through the whole vehicle metal body. In another example, a corrosion protection device according to the present disclosure may be configured with a plug to insert into a standard cigarette lighter, or a complementary interface connector for a vehicle on-board diagnostics (OBD) port. Generally speaking, a corrosion protection device according to the present disclosure may be easily connected to any suitable power source that has a common return path for radiating the corrosion signal to reduce the development of corrosion. The device may be connected or coupled to both the power source and to the metal object(s), for example when there may already be a preexisting coupling between the power source and the metal object(s). For instance, in a vehicle, the electrical system of the vehicle is typically coupled to at least part of the frame or body of the vehicle. In this way, a corrosion protection device may be coupled to the electrical system to both receive power from a power source (e.g. battery, etc.) and to also propagate an anti-corrosion signal through at least part of the vehicle.

Figure 3B:
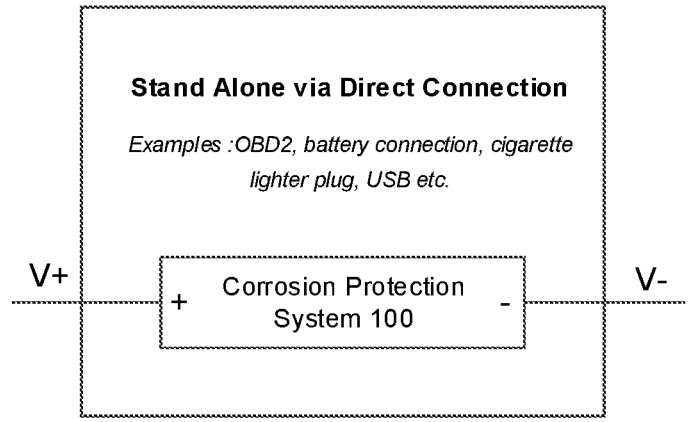
FIG. 3B and FIG. 3C are block diagrams showing example ways of coupling a corrosion protection device to an electrical system.
Figure 3C:
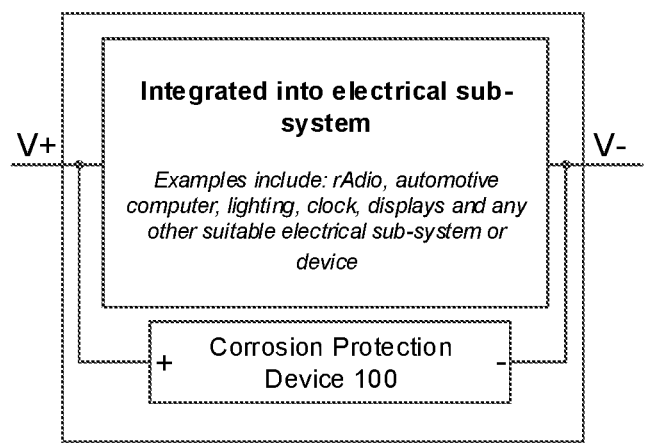

FIG. 3B and FIG. 3C are block diagrams showing just some example ways of coupling a corrosion protection device 100 according to the present disclosure to an electrical system for providing corrosion protection to a metal object(s). In an embodiment, the metal object(s) may be parts of a vehicle, and the electrical system may be an electrical system of the vehicle comprising a battery.

FIG. 3B shows a possible setup where corrosion protection device 100 is directly connected or coupled to the electrical system. This may include connecting device 100 to the electrical system via an electrical connection interface, such as an OBD port, battery connection, cigarette lighter plug, USB port, etc. These are merely examples. Accordingly, two terminals of device 100 may be coupled to two connection points or conductors in a OBD port, USB port, etc.

FIG. 3C shows a possible setup where corrosion protection device 100 is integrated into an electrical system. For instance, device 100 may be installed into, or integrated with, any suitable electrical device in a vehicle. For example, device 100 may be part of a radio system, lighting system, computer system, USB dongle, cigarette lighter receptacle, display system, car clock, etc., which could get installed for example at the vehicle factory.

In an embodiment, a corrosion protection device according to the present disclosure may be coupled continuously or regularly to a power source to enable a continual corrosion protection effect on the metal object. In an example, corrosion protection device may be able to obtain power from a battery of a vehicle even when the vehicle is not running. In this way, corrosion protection may be provided while the vehicle is parked, which, depending on the vehicle, may be a majority of the time.

FIG. 3 shows that corrosion protection device 100 may comprise a controller 130 and/or a test connection 140. Controller 130 may comprise a processor 134, and/or a memory 132, and may be configured to provide part or full control of the operation of device 100, including the generation of the waveform signal, and may be communicatively coupled to corrosion protection module 110. Further, controller 130 may be configured to perform other operations. Test connection 140 may provide a communications interface for any suitable purpose(s), for example for performing tests on device 100, and/or for uploading and/or downloading data and/or updated software and/or firmware.

In other embodiments, the functions, operations, and/or structures of corrosion protection module 110 and controller 130 may not be divided as described and shown. For example, some or all of the functions, operations, and/or structures of corrosion protection module 110 may be located or performed at controller 130. Alternatively or additionally, some or all of the functions, operations, and/or structures of controller 130 may be located or performed at corrosion protection module 110. Alternatively, controller 130 may be part of corrosion protection module 110. Other configurations are also possible.

Figure 4:
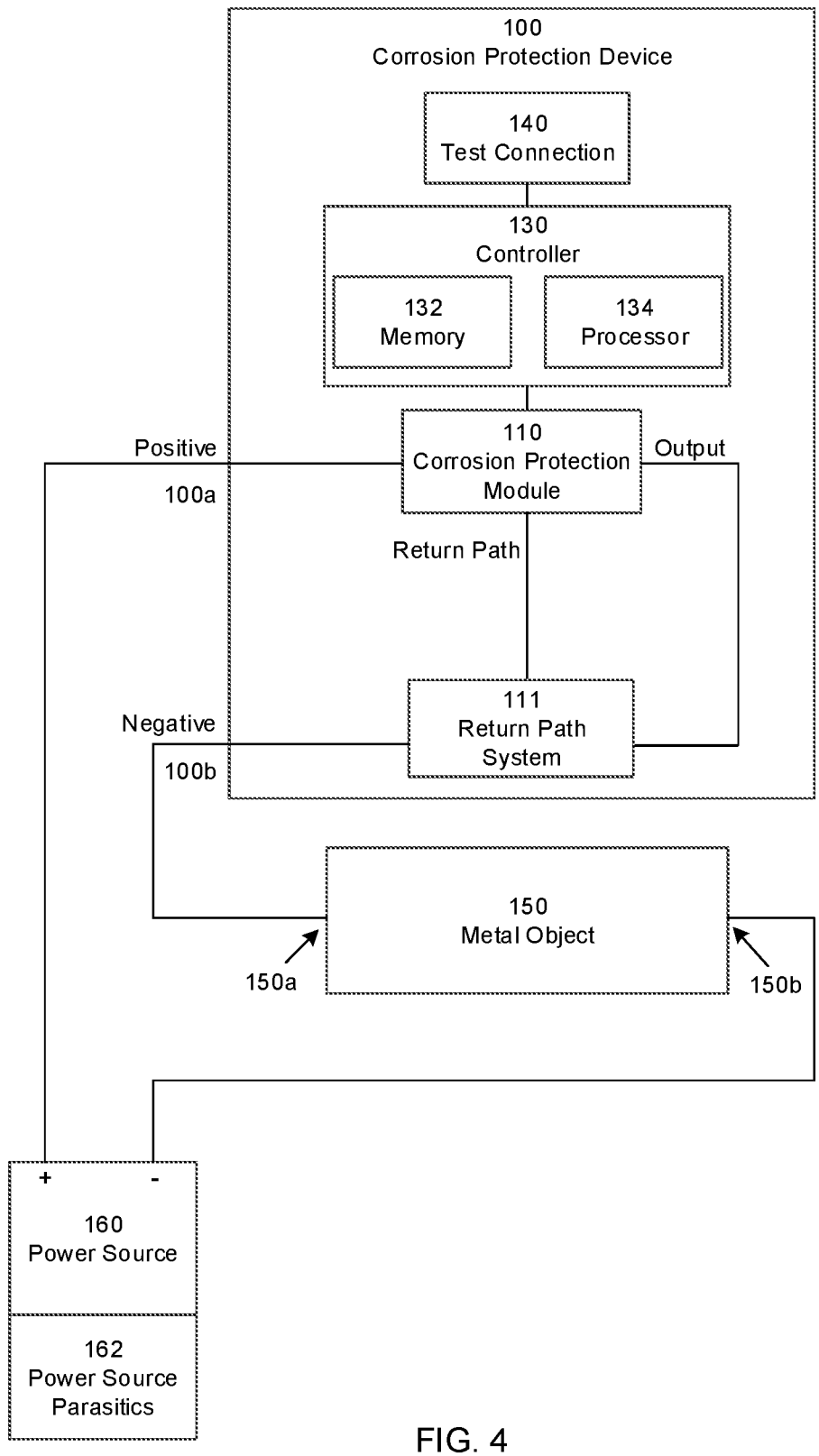
FIG. 4 is a block diagram of an embodiment of a corrosion protection device in another example application.

FIG. 4 is a block diagram showing a different example configuration with corrosion protection device 100 relative to the setup of FIG. 3. In FIG. 4, like the configuration of FIG. 3, negative terminal 100b of corrosion protection device 100 may be coupled directly to metal object 150. However, unlike FIG. 3, in FIG. 4 negative terminal 100b of device 100 is not directly coupled to the negative node of power source 160. Rather, the negative node of power source 160 is instead coupled directly to metal object 150, and this connection point 150b may be positioned at a location that is spaced apart from the location of connection point 150a coupled to negative terminal 100b of device 100. Accordingly, negative terminal 100b of corrosion protection device 100 is coupled in series with the metal object 150 and negative node of power source 160. FIG. 4 also shows possible power source parasitics 162, which may represent, for instance, a parasitic battery drain when power source 160 is a battery (for example, a vehicle battery).

Figure 5:
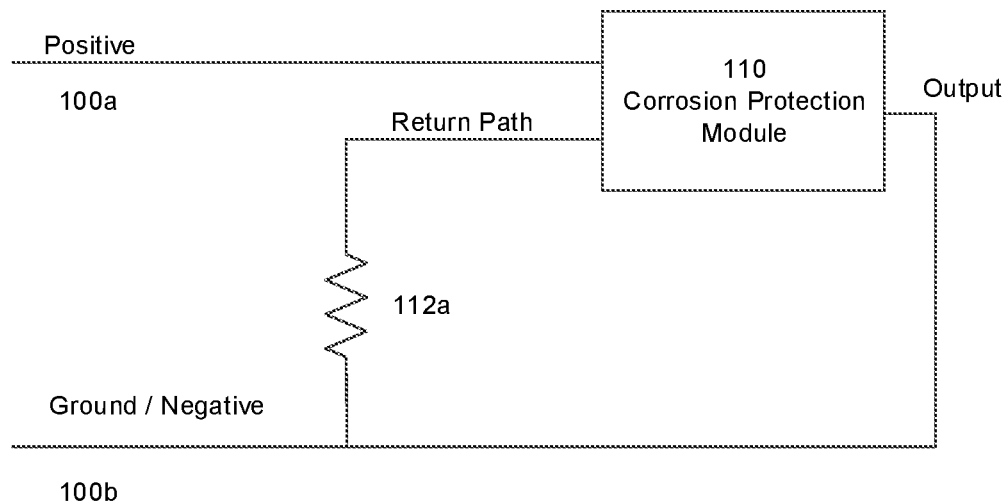
FIGS. 5 to 9 are circuit diagrams in example embodiments showing a corrosion protection module and a return path system.

FIG. 5 is a circuit diagram in an example embodiment showing corrosion protection module 110 and return path system 111, wherein system 111 comprises a choke device 112 as shown in FIG. 3A. In the example embodiment of FIG. 5, choke device 112 comprises a resistor(s) 112a to float the return path and create a voltage potential between the return path and the ground/negative path at terminal 100b. A resistor value may be of any suitable value. For example, resistor values may range from 10 ohm up to 60K ohm and possibly beyond depending on the anti-corrosion circuitry. In an embodiment, an optimal value may be determined by using Ohm's law, where R=V÷I. R=the resistance value, V is the minimum operating DC voltage and I is the DC operating current of the anti-corrosion circuitry (e.g. in corrosion protection device 100).

Figure 6:
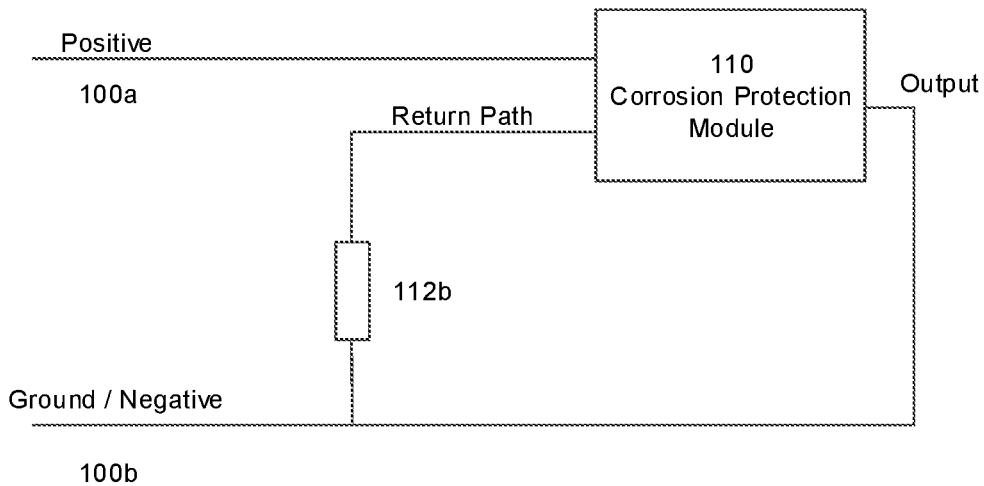

FIG. 6 is a circuit diagram, similar to FIG. 5, of another example embodiment. In the example embodiment of FIG. 6, choke device 112 comprises a ferrite bead 112b to float the return path and create a voltage potential between the return path and the ground/negative path at terminal 100b. The ferrite bead has both a resistive and AC component (impedance). Ferrite beads are available in small sizes and can function as an inductor. In an embodiment, when selecting a ferrite bead, the lowest DC resistance should be selected with the highest AC impedance.

Figure 7:
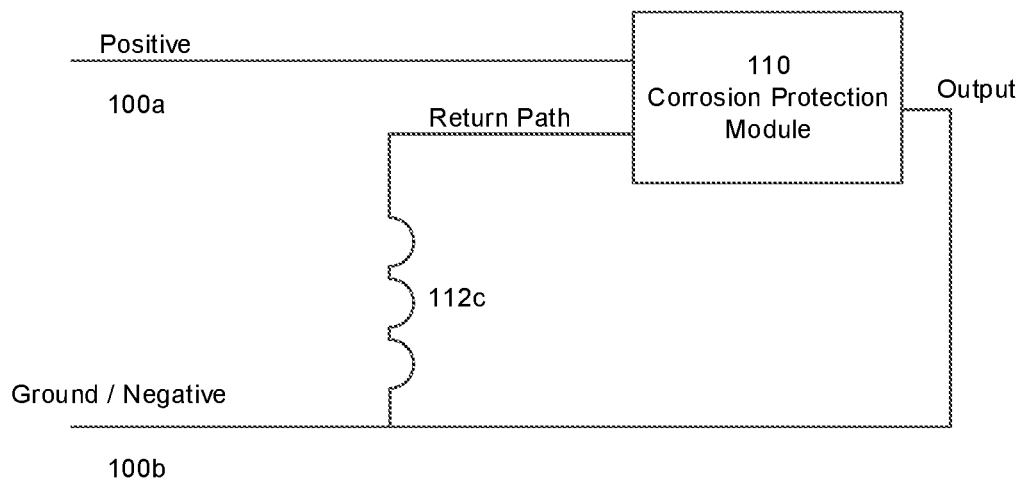

FIG. 7 is a circuit diagram, similar to FIG. 5, of another example embodiment. In the example embodiment of FIG. 7, choke device 112 comprises an inductor 112c to float the return path and create a voltage potential between the system return path and the ground/negative path at terminal 100b. In an embodiment, the inductance value of the inductor 112c may be calculated by using the formula $XL=2\times\pi\times F\times L$ where XL is impedance, F is the frequency of the anti-corrosion waveform signal, and L is the inductance value. The formula may be reconfigured to be $L=XL\div(2\times\pi\times F)$. This allows to solve for an inductance value. In an embodiment, the reactance (XL) value may be chosen to have a high impedance. Because, in at least certain embodiments, the current is very low in the corrosion protection device 100, a current carrying capability of the inductor may not be important. In an embodiment, the inductance value is selected from the range of 10 uH through 200 uH. Inductance values outside of this range may be selected depending on other design parameters in the corrosion protection device 100.

Figure 8:
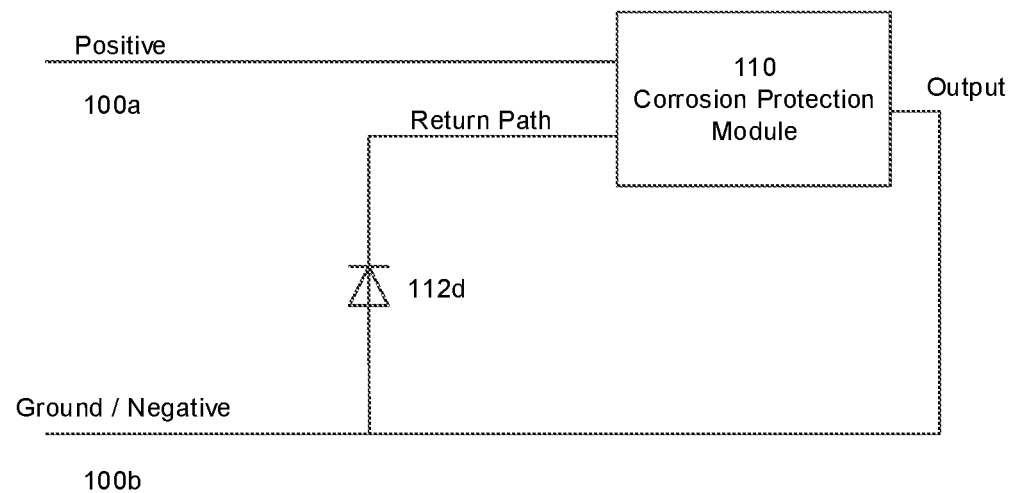

FIG. 8 is a circuit diagram, similar to FIG. 5, of another example embodiment. In the example embodiment of FIG. 8, choke device 112 may comprise one or more of various types of diodes 112d to float the return path and create a voltage potential between the return path and the ground/negative path at terminal 100b. Examples of such diodes 112d include regular diodes, Zener diodes and Schottky diodes. As the diode 112d is forward biased from the anti-corrosion signal, it develops a voltage drop that causes energy to exit the ground/negative path. In some embodiments, this may not the most efficient method relative to others described herein, however it may still be used.

Figure 9:
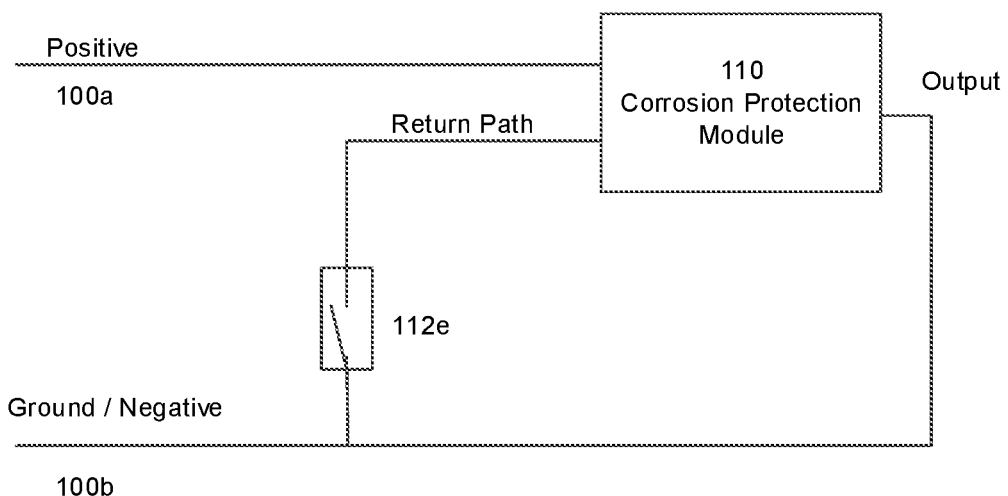

FIG. 9 is a circuit diagram, similar to FIG. 5, of another example embodiment. In the example of FIG. 9, choke device 112 may include a switching device 112e to float the return path and create a voltage potential between the return path and the ground/negative path at terminal 100b. Switching device 112e may electrically decouple output port 110b from return port 110c while the waveform signal is generated, and may electrically couple second terminal 100b to return port 110c while the waveform signal is not being generated. Examples of a switching device 112e include a transistor or field-effect transistor (FET). Because the switching device 112e is an active component, a slightly different configuration for the corrosion protection device may be required, as illustrated in FIG. 10 for example.

Figure 10:
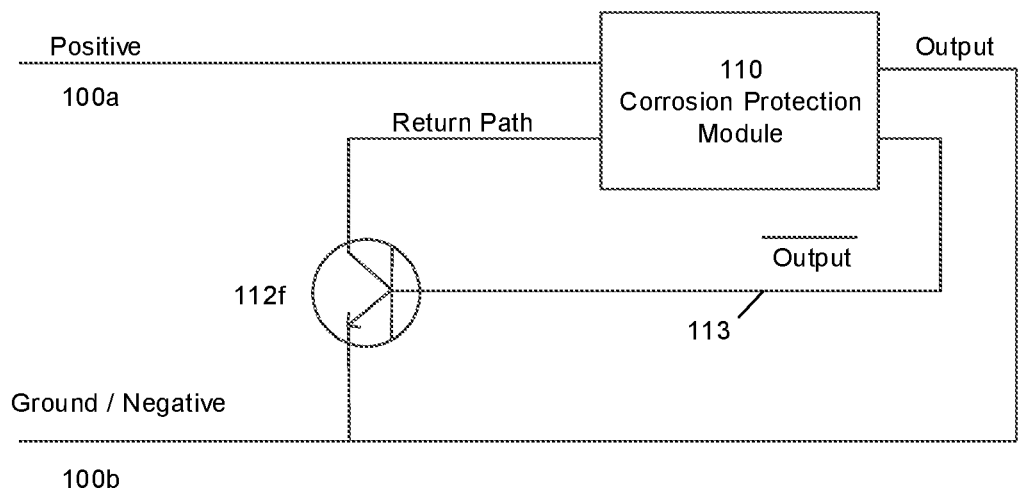
FIG. 10 is a circuit diagram example of the corrosion protection device of FIG. 9.

In FIG. 10, the return path may include an NPN/PNP transistor or FET 112f to accomplish the switching of the return path. Circuitry, such as a controller 130, may be configured to turn on the transistor during the generation of the anti-corrosion waveform signal, followed by turning off the transistor to disconnect the ground/negative path from the return path, forcing the current to exit the ground/negative path. In FIG. 10, the transistor control signal 113 is shown. This signal may trigger the switch during the off time so-as-to redirect the current through the single ground/negative path.

The example embodiments shown in FIGS. 5-10 are illustrative only, and other types of passive or active return path devices 111, or choke devices 112, may be used to create a switch to ground or creates an AC/DC load between the return (negative wire) and the anti-corrosion waveform signal. Further, in an embodiment, choke device 112 may comprise two or more components, for example including one or more of those of the embodiments of FIGS. 5 to 10.

Further, processes and methods according to the present disclosure are also provided. As a mere example, an example method for reducing a rate of corrosion of a metal object may comprise the following. A corrosion protection device having first and second terminals is provided. The device may be coupled to the metal object using the second terminal of the device. An electrical waveform signal is generated having a temporal AC component at a corrosion protection module of the device. The electrical waveform signal is returned to the corrosion protection module, wherein the returning comprises blocking the temporal AC component of the waveform signal. The electrical waveform signal is provided to the second terminal for inducing a current in the metal object.

In at least some embodiments, a corrosion protection device according to the present disclosure has only two connection terminals for coupling to a power source and to a metal object to be protected.

In at least some embodiments, a corrosion protection device according to the present disclosure is coupled to the metal object(s) to be protected in the absence of an electrolyte. For instance, the metal objects to be protected need not be immersed in an electrolyte.

In at least some embodiments, the use of low voltages eliminates the risks associated with exposing humans or animals to high voltages.

A corrosion protection device and/or method according to the present disclosure may be used in any suitable application, for example in various industrial application whereas non-cathodic protection is the preferred anti-corrosion solution. This includes industrial equipment and infrastructure.

Figure 11:
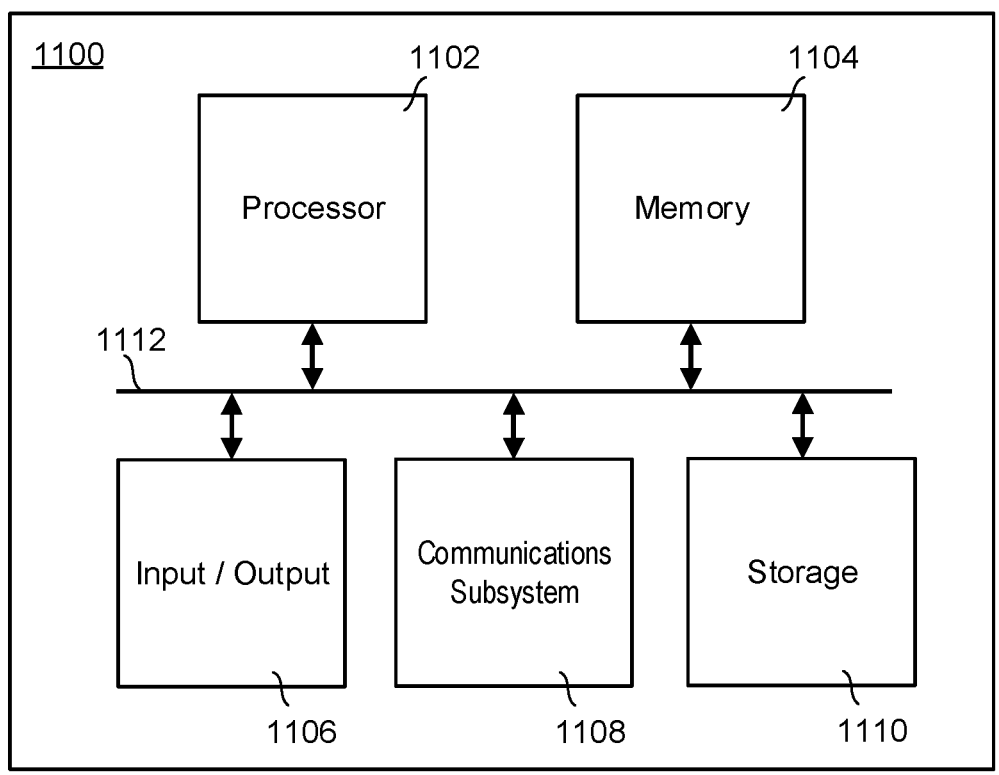
FIG. 11 is a block diagram of an example computing device or system.

FIG. 11 is a block diagram of an example computerized device or system 1100 that may be used in implementing one or more aspects or components of an embodiment according to the present disclosure. For example, system 1100 may be used to implement a computing device or system, such as a controller (for example, controller 130), to be used with a device, system or method according to the present disclosure.

Computerized system 1100 may include one or more of a processor 1102, memory 1104, a mass storage device 1110, an input/output (I/O) interface 1106, and a communications subsystem 1108. Further, system 1100 may comprise multiples, for example multiple processors 1102, and/or multiple memories 1104, etc. Processor 1102 may comprise one or more of a digital processor, an analog processor, a digital circuit designed to process information, an analog circuit designed to process information, a state machine, and/or other mechanisms for electronically processing information. These processing units may be physically located within the same device, or the processor 1102 may represent processing functionality of a plurality of devices operating in coordination. The processor 1102 may be configured to execute modules by software; hardware; firmware; some combination of software, hardware, and/or firmware; and/or other mechanisms for configuring processing capabilities on the processor 1102, or to otherwise perform the functionality attributed to the module and may include one or more physical processors during execution of processor readable instructions, the processor readable instructions, circuitry, hardware, storage media, or any other components.

One or more of the components or subsystems of computerized system 1100 may be interconnected by way of one or more buses 1112 or in any other suitable manner.

The bus 1112 may be one or more of any type of several bus architectures including a memory bus, storage bus, memory controller bus, peripheral bus, or the like. The CPU 1102 may comprise any type of electronic data processor. The memory 1104 may comprise any type of system memory such as dynamic random access memory (DRAM), static random access memory (SRAM), synchronous DRAM (SDRAM), read-only memory (ROM), a combination thereof, or the like. In an embodiment, the memory may include ROM for use at boot-up, and DRAM for program and data storage for use while executing programs.

The mass storage device 1110 may comprise any type of storage device configured to store data, programs, and other information and to make the data, programs, and other information accessible via the bus 1112. The mass storage device 1110 may comprise one or more of a solid state drive, hard disk drive, a magnetic disk drive, an optical disk drive, or the like. In some embodiments, data, programs, or other information may be stored remotely, for example in the cloud. Computerized system 1100 may send or receive information to the remote storage in any suitable way, including via communications subsystem 1108 over a network or other data communication medium.

The I/O interface 1106 may provide interfaces for enabling wired and/or wireless communications between computerized system 1100 and one or more other devices or systems. For instance, I/O interface 1106 may be used to implement test connection 140 of corrosion protection device 100. Furthermore, additional or fewer interfaces may be utilized. For example, one or more serial interfaces such as Universal Serial Bus (USB) (not shown) may be provided.

Computerized system 1100 may be used to configure, operate, control, monitor, sense, and/or adjust devices, systems, and/or methods according to the present disclosure.

A communications subsystem 1108 may be provided for one or both of transmitting and receiving signals over any form or medium of digital data communication, including a communication network. Examples of communication networks include a local area network (LAN), a wide area network (WAN), an inter-network such as the Internet, and peer-to-peer networks such as ad hoc peer-to-peer networks. Communications subsystem 2008 may include any component or collection of components for enabling communications over one or more wired and wireless interfaces. These interfaces may include but are not limited to USB, Ethernet (e.g. IEEE 802.3), high-definition multimedia interface (HDMI), Firewire™ (e.g. IEEE 1394), Thunderbolt™, WiFi™ (e.g. IEEE 802.11), WiMAX (e.g. IEEE 802.16), Bluetooth™, or Near-field communications (NFC), as well as GPRS, UMTS, LTE, LTE-A, and dedicated short range communication (DSRC). Communication subsystem 1108 may include one or more ports or other components (not shown) for one or more wired connections. Additionally or alternatively, communication subsystem 1108 may include one or more transmitters, receivers, and/or antenna elements (none of which are shown).

Computerized system 1100 of FIG. 11 is merely an example and is not meant to be limiting. Various embodiments may utilize some or all of the components shown or described. Some embodiments may use other components not shown or described but known to persons skilled in the art.

Testing of a two terminal corrosion protection device according to the present disclosure has proven its effectiveness for reducing the rate of corrosion on a metal panel. The testing setup is first described followed by a summary of the test result.

The test was conducted in a laboratory using a corrosion chamber and employing a method adapted from ASTM B-117 with the following changes: (1) exposure time is 500 hours, and (2) the electrolyte is 0.01 molar sodium carbonate.

Each specimen is a six inch by eight inch galvanized steel panel that has been coated per standard automotive procedures (electrophoretic coat, primer, base, and clear coat). There are two groups of panels in each experiment: a 'control' group (these panels are not protected by the module) and a 'test' group (these panels are protected by a two-wire embodiment of the corrosion protection device). There are sixteen identical specimens in each group, each experiment therefore using 32 panels (specimens) total. Sixteen specimens are used in each group to permit a statistical analysis of the amount of rust that forms on the scribe in each group. More details on this analysis appear below. The amount of rust that forms on any one scribe is random, due to the random nature of the processes that occur during rusting, such as how the fog deposits on the scribe. However, when comparing the controls as a group (sixteen panels) and test as a group (sixteen panels), less rust is detected on the tests, indicating a positive effect of the two wire corrosion protection device of the presently shown embodiments.

Each specimen is scribed, i.e. a four inch long scratch is made across the center of the panel, to introduce a standardized damage site for corrosion to occur in. This is done with a Dremel™ rotary tool with a cut-off wheel (abrasive disk), using a fresh cut-off disk for each specimen to make each scribe as similar as possible.

Each of the sixteen test specimens is protected by its own corrosion protection device. In the two-wire test, the two wires connected to the panel are the power supply and the module driven/ground wire. Although there are only two wires from the module, four holes are drilled along the top of the panel and four along the bottom to make the connections. Each of the two wires has a 4-way in the lead to distribute the wire into four pigtail leads. The purpose of this is to distribute the current uniformly across the scribe. The module wires, which are terminated in ring terminals, are connected to the panel with stainless steel hardware. These connections are covered in waterproof epoxy putty to prevent corrosion of the electrical connections.

The panels are exposed in environmental chambers manufactured by Q-Lab. The sixteen control panels are in one chamber and the sixteen test panels are in another chamber. The tested module has a repetition rate of 2.5 kHz with peak-to-peak output current of 350 mA, with an average current of 0.3 mA. It should be noted that this configuration of the module is intended to demonstrate a worst case corrosion reduction situation.

The conditions of the two chambers are controlled as closely as possible. Among these, the fog collection rate and distribution are carefully controlled. The concentration of the electrolyte is also checked. Other factors are under control of the chamber, such as temperature. In other words, an incorrect temperature would generate an alarm.

After the test is completed, the control and test specimens are removed for analysis to determine the effectiveness of the corrosion protection device in reducing corrosion of the test scribes relative to the control scribes. This is done through an image capture and processing analysis to detect the amount of corrosion present on the total area of each scribe. By example, the analysis can determine that a scribe has result of 0.3, meaning that it has 30% of its area covered in rust. Hence this analysis can compare worst case corrosion level of the control scribe to best case corrosion level of a test scribe. Another comparison can consist of the average of the control scribes and the average of the test scribes corrosion levels. This can be expressed as a ratio of control scribe/test scribe. A ratio greater than one indicates that, on average, the control panel scribes have more rust than the test panel scribes, which is a positive result. The higher the number, the worse the control panels are and the better the test panels are.

For the tested module having a repetition rate of 2.5 kHz with peak-to-peak output current of 350 mA, the average effectiveness ratio was 1.19. This is a positive indication that the two wire module is effective for reducing corrosion. However, it can be extrapolated that by increasing the repetition rate and/or output current will increase this ratio, thereby providing further improved corrosion prevention resistance.

Some embodiments described herein relate to corrosion protection devices that may be used with vehicles. However, the scope of the present disclosure is not intended to be limited to applications involving vehicles. The teachings according to the present disclosure may be used or applied in or with other applications and in other fields.

As used herein, the terms "connected", "connection", and "coupled" generally mean that the referred to elements are electrically connected, whether directly or indirectly, such that an electrical current may flow from one to the other. The connection may include a direct conductive connection, an inductive connection, a capacitive connection, and/or any other suitable electrical connection. Intervening components may be present.

In the preceding description, for purposes of explanation, numerous details are set forth in order to provide a thorough understanding of the embodiments. However, it will be apparent to one skilled in the art that these specific details are not required. In other instances, well-known electrical structures and circuits are shown in block diagram form in order not to obscure the understanding. For example, specific details are not provided as to whether the embodiments described herein are implemented as a software routine, hardware circuit, firmware, or a combination thereof.

In at least some embodiments, one or more aspects or components may be implemented by one or more special-purpose computing devices. The special-purpose computing devices may be any suitable type of computing device, including desktop computers, portable computers, handheld computing devices, networking devices, or any other computing device that comprises hardwired and/or program logic to implement operations and features according to the present disclosure.

Embodiments of the disclosure may be represented as a computer program product stored in a machine-readable medium (also referred to as a computer-readable medium, a processor-readable medium, or a computer usable medium having a computer-readable program code embodied therein). The machine-readable medium may be any suitable tangible, non-transitory medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the disclosure. Those of ordinary skill in the art will appreciate that other instructions and operations necessary to implement the described implementations may also be stored on the machine-readable medium. The instructions stored on the machine-readable medium may be executed by a processor or other suitable processing device, and may interface with circuitry to perform the described tasks.

The structure, features, accessories, and alternatives of specific embodiments described herein and shown in the Figures are intended to apply generally to all of the teachings of the present disclosure, including to all of the embodiments described and illustrated herein, insofar as they are compatible. In other words, the structure, features, accessories, and alternatives of a specific embodiment are not intended to be limited to only that specific embodiment unless so indicated.

In addition, the steps and the ordering of the steps of methods and data flows described and/or illustrated herein are not meant to be limiting. Methods and data flows comprising different steps, different number of steps, and/or different ordering of steps are also contemplated. Furthermore, although some steps are shown as being performed consecutively or concurrently, in other embodiments these steps may be performed concurrently or consecutively, respectively.

If any other documents and/or information are incorporated by reference herein, then, to the extent that there are any discrepancies or inconsistencies between those other documents and/or information and the content of the present application, the content of the present application is generally intended to govern.

The above-described embodiments are intended to be examples only. Alterations, modifications and variations can be effected to the particular embodiments by those of skill in the art. The scope of the claims should not be limited by the particular embodiments set forth herein, but should be construed in a manner consistent with the specification as a whole.

The invention claimed is:

1. A corrosion protection device comprising:
   a first terminal and a second terminal for receiving power at the corrosion protection device from a power source external to the corrosion protection device to power the corrosion protection device, the first terminal and a second terminal for coupling to a respective first node and second node of the power source, and the second terminal for coupling to a metal object;

a corrosion protection module for generating an electrical waveform signal having a temporal AC component at an output port of the corrosion protection module, wherein the output port is coupled to the second terminal for providing the temporal AC component of the waveform signal at the second terminal for reducing a rate of corrosion of the metal object; and a choke device coupling the output port to a return port of the corrosion protection module such that the choke blocks the temporal AC component of the waveform signal from entering the return port, and such that the temporal AC component of the waveform signal is able to flow to the second terminal.

2. The corrosion protection device of claim 1, configured for coupling the power source and the metal object to the device via only the first and second terminals.

3. The corrosion protection device of claim 1, wherein the second terminal is a negative terminal for receiving a negative voltage from the power source.

4. The corrosion protection device of claim 1, wherein the corrosion protection module further comprises an input port, wherein the input port is coupled to the first terminal.

5. The corrosion protection device of claim 1, wherein the choke device comprises a resistor and/or an inductor.

6. The corrosion protection device of claim 1, wherein the choke device comprises a ferrite bead.

7. The corrosion protection device of claim 1, wherein the choke device comprises a diode.

8. The corrosion protection device of claim 1 wherein the choke device comprises a switching device that electrically decouples the output port from the return port while the waveform signal is generated, and that electrically couples the second terminal to the return port while the waveform signal is not being generated.

9. The corrosion protection device of claim 1, wherein the electrical waveform signal has a frequency within the range of 20 Hz to 1 MHz.

10. A method for reducing a rate of corrosion of a metal object, the method comprising:

providing a corrosion protection device having first and second terminals;

coupling the first and second terminals of the device to first and second nodes of a power source;

coupling the device to the metal object via the second terminal of the device;

generating an electrical waveform signal having a temporal AC component at an output port of a corrosion protection module of the device;

returning the electrical waveform signal to a return port of the corrosion protection module, wherein the returning comprises blocking the temporal AC component of the waveform signal; and providing the electrical waveform signal to the second terminal for inducing a current in the metal object for reducing a rate of corrosion of the metal object.

11. The method of claim 10, further comprising coupling the power source and the metal object to the device via only the first and second terminals, wherein the power source powers the device.

12. The method of claim 10, wherein the second terminal is a negative terminal for receiving a negative voltage from the power source.

13. The method of claim 10, further comprising coupling the first terminal to an input port of the corrosion protection module.

14. The method of claim 10, wherein the blocking involves the use of a resistor and/or inductor.

15. The method of claim 10, wherein the blocking involves the use of a ferrite bead.

16. The method of claim 10, wherein the blocking involves the use of a diode.

17. The method of claim 10, wherein the blocking involves blocking the entire electrical waveform signal while the waveform signal is generated, and coupling the second terminal to the return port of the corrosion protection module while the waveform signal is not being generated.

18. The method of claim 10, wherein the electrical waveform signal has a frequency within the range of 20 Hz to 1 MHz.

19. The method of claim 10, wherein the metal object is part of a vehicle.

20. A device, comprising a first terminal and a second terminal for receiving power at the device from a power source external to the device to power the device, the first terminal and a second terminal for coupling to the power source, and the first terminal for coupling to a metal object;

a corrosion protection module having an output port and a return port, the corrosion protection module configured to output, from the output port, an anti-corrosion signal having an AC component, the output port being coupled to the first terminal for providing the anti-corrosion signal at the first terminal for reducing a rate of corrosion of the metal object; and a return path device coupled in series between the output port and the return port and being configured to prevent the AC component of the anti-corrosion signal from entering the return port.

21. The corrosion protection device of claim 20, configured for coupling the power source and the metal object to the device via only the first and second terminals.

22. The device of claim 20, wherein the first terminal is configured for coupling to a negative node of the power source.

23. The device of claim 20, wherein the second terminal is configured for coupling to a positive node of the power source.

24. The device of claim 23, wherein the corrosion protection module further comprises an input port coupled to the second terminal.

25. The device of claim 20, wherein the return path device includes a resistor.

26. The device of claim 20, wherein the return path device includes a ferrite bead.

27. The device of claim 20, wherein the return path device includes an inductor.

28. The device of claim 20, wherein the return path device includes a diode.

29. The device of claim 20, wherein the return path device includes a switching device that electrically decouples the output port from the return port while outputting the anti-corrosion signal and electrically couples the second terminal to the return port while not outputting the anti-corrosion signal.

30. The device of claim 20, wherein the anti-corrosion signal has a frequency within the range of 20 Hz to 1 MHz.

* * * * *

(12) EX PARTE REEXAMINATION CERTIFICATE (12487th)

United States Patent
Giatis

(10) Number: US 11,598,010 C1
(45) Certificate Issued: Jan. 19, 2024

(54) TWO TERMINAL CORROSION PROTECTION DEVICE, SYSTEM, AND METHOD

(71) Applicant: Canadian Auto Preservation Inc., Richmond Hill (CA)

(72) Inventor: Petros Z. Giatis, Hinckley, OH (US)

(73) Assignee: CANADIAN AUTO PRESERVATION INC., Richmond Hill (CA)

Reexamination Request:
No. 90/019,214, May 25, 2023

Reexamination Certificate for:
Patent No.: 11,598,010
Issued: Mar. 7, 2023
Appl. No.: 17/232,967
Filed: Apr. 16, 2021

Related U.S. Application Data

(63) Continuation-in-part of application No. PCT/CA2020/051417, filed on Oct. 22, 2020.

(60) Provisional application No. 62/925,486, filed on Oct. 24, 2019.

(51) Int. Cl.
*C23F 13/00* (2006.01)
*H03K 5/1252* (2006.01)

(52) U.S. Cl.
CPC .......... *C23F 13/005* (2013.01); *H03K 5/1252* (2013.01); *C23F 2213/10* (2013.01); *C23F 2213/20* (2013.01)

(58) Field of Classification Search
None
See application file for complete search history.

(56) References Cited

To view the complete listing of prior art documents cited during the proceeding for Reexamination Control Number 90/019,214, please refer to the USPTO's Patent Electronic System.

*Primary Examiner* — Leonardo Andujar

(57) ABSTRACT

A corrosion protection device, system, and method are provided. The device may operate while being coupled to the object being protected and to a power source using a total of only two terminals. This may be accomplished by dereferencing the return path node of the circuit using a choke device that blocks a temporal AC component of an anticorrosion signal. The choke device therefore diverts the anticorrosion signal to a single negative/ground path to the object and then returns through a positive lead of the circuit. A two terminal corrosion protection device may thereby simplify the installation process, for example on a vehicle, by not requiring that another connection be made to the object at a spaced apart location from a first connection to the object.

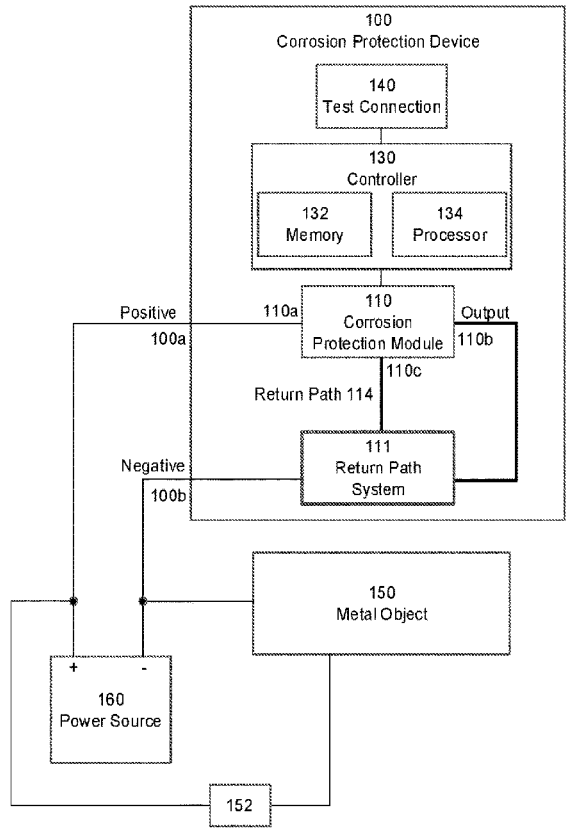

EX PARTE REEXAMINATION CERTIFICATE

NO AMENDMENTS HAVE BEEN MADE TO THE PATENT

AS A RESULT OF REEXAMINATION, IT HAS BEEN DETERMINED THAT:

The patentability of claims 1 and 20 is confirmed.

Claims 2-19 and 21-30 were not reexamined.

\* \* \* \* \*